(12) United States Patent
Pun et al.

(10) Patent No.: US 9,637,376 B2
(45) Date of Patent: *May 2, 2017

(54) GYRO MEMS SENSOR PACKAGE

(71) Applicant: Compass Technology Company Limited, Hong Kong (HK)

(72) Inventors: Kelvin Po Leung Pun, Hong Kong (HK); Chee Wah Cheung, Hong Kong (HK)

(73) Assignee: Compass Technology Company Limited, Shatin (HK)

( * ) Notice: Subject to any disclaimer, the term of this patent is extended or adjusted under 35 U.S.C. 154(b) by 0 days.

This patent is subject to a terminal disclaimer.

(21) Appl. No.: 15/133,309

(22) Filed: Apr. 20, 2016

(65) Prior Publication Data

US 2016/0229686 A1 Aug. 11, 2016

Related U.S. Application Data

(63) Continuation of application No. 14/580,297, filed on Dec. 23, 2014, now Pat. No. 9,360,318.

(51) Int. Cl.
| | | |
|---|---|---|
| *H01L 23/02* | (2006.01) | |
| *B81B 7/00* | (2006.01) | |
| *G01C 19/00* | (2013.01) | |
| *G01C 19/5783* | (2012.01) | |
| *B81C 1/00* | (2006.01) | |

(52) U.S. Cl.
CPC .......... *B81B 7/007* (2013.01); *B81C 1/00301* (2013.01); *G01C 19/00* (2013.01); *G01C 19/5783* (2013.01); *B81B 2201/0242* (2013.01); *B81B 2207/097* (2013.01)

(58) Field of Classification Search
USPC ... 257/E23.01, 416, 678, E21.503, E23.125, 257/E31.122, 254, 433, 731, 778
See application file for complete search history.

(56) References Cited

U.S. PATENT DOCUMENTS

| | | | |
|---|---|---|---|
| 6,784,020 B2 | 8/2004 | Lee et al. | |
| 8,368,154 B2 | 2/2013 | Trusov et al. | |
| 8,653,642 B2 | 2/2014 | Sutanto et al. | |
| 8,804,993 B2 | 8/2014 | Shukla et al. | |
| 9,360,318 B1* | 6/2016 | Pun .......... | G01C 19/00 |
| 2007/0013052 A1* | 1/2007 | Zhe .......... | B81C 1/0023 |
| | | | 257/704 |
| 2009/0218668 A1* | 9/2009 | Zhe .......... | B81C 1/00301 |
| | | | 257/680 |
| 2012/0318059 A1* | 12/2012 | Otsuki .......... | H01L 23/057 |
| | | | 73/504.12 |

(Continued)

OTHER PUBLICATIONS

"Design, Fabrication and Testing of Miniaturised Wireless Inertial Measurement Units (IMU)," by J. Barton et al., Electronic Components and Technology Conference, Proceedings 57th. May 29, 2007-Jun. 1, 2007, pp. 1143-1148.

*Primary Examiner* — Tram H Nguyen
(74) *Attorney, Agent, or Firm* — Saile Ackerman LLC; Stephen B. Ackerman; Rosemary L.S. Pike

(57) ABSTRACT

An integrated circuit packaging structure comprises at least one Micro Electrical Mechanical Systems (MEMS) gyroscope die mounted directly on a multi-layer flexible substrate having at least one metal layer and wire-bonded to the flexible substrate and a lid or die coating protecting the MEMS die and wire bonds.

20 Claims, 5 Drawing Sheets

(56) References Cited

U.S. PATENT DOCUMENTS

| | | | |
|---|---|---|---|
| 2013/0247663 A1* | 9/2013 | Patel | G01C 19/5776 73/504.12 |
| 2014/0260678 A1* | 9/2014 | Jentoft | G01L 5/16 73/862.046 |
| 2015/0009549 A1* | 1/2015 | Khechana | B81C 3/005 359/199.3 |

* cited by examiner

GYRO MEMS SENSOR PACKAGE

This is a continuation application of U.S. Ser. No. 14/580,297 filed on Dec. 23, 2014, herein incorporated by reference in its entirety, and which is assigned to a common assignee.

BACKGROUND OF THE INVENTION (1) Field of the Invention

The invention relates to processes for packaging integrated circuit dies, and more particularly, to a method of packaging gyroscope sensor modules.

(2) Description of the Related Art

The miniaturization of electronics drives the expansion of product functionality and application. However, the application of the gyroscope ('gyro') sensor module has been limited due to the size and weight of the MEMS (Micro Electrical Mechanical Systems) gyro package. Currently, MEMS gyros are available commercially in the form of a package within which the MEMS die 24 is mounted by wire bonding 28, as shown in FIG. 1. For protection the die is contained in an enclosure 20 with a lid 22 which is normally ceramic and/or metallic. On one side of the package, solder ball grid array (BGA) 15 is present to allow the package to be mounted on the main circuit board 10 by solder reflow. Such package design provides a rigid structure to hold the MEMS die, as well as the overall shape of the package allowing it to be handled easily by standard surface mount technology (SMT) processes.

To reduce the spatial requirement of the main circuit board, high density circuitry on multilayer printed circuit boards (PCBs) are available. However, the size of the gyro packages has become a key factor which limits its application in small portable devices, especially when up to three MEMS gyroscopes are required to sense and respond to X-, Y- and Z-axis movements. As demonstrated by J. Barton et al, "Design, Fabrication and Testing of Miniaturized Wireless Inertial Measurement Units (IMU)," IEEE, 2007, a 10 mm SMD IMU sensor could be produced but with little room left for further size reduction due to the large footprint of the gyro packages.

Therefore, the design of gyro sensor modules has been optimized for applications in small, portable devices. By redesigning the MEMS enclosure, the size and thus the weight of the MEMS gyro could be reduced. Consequently, the main circuit board can also reduce in size through the use of a multi-layer flexible substrate and increasing the circuit density. Such smaller, lighter assemblies can be incorporated into a greater variety of portable and mobile devices which opens up opportunities for new applications.

U.S. Pat. No. 6,784,020 (Lee et al), U.S. Pat. No. 8,804,993 (Shulka), U.S. Pat. No. 8,653,642 (Sutanto et al), and U.S. Pat. No. 8,368,154 (Trusov et al) and U.S. Patent Application 2012/0318059 (Otsuki) disclose MEMS devices mounted on flexible substrates.

SUMMARY OF THE INVENTION

A principal object of the present invention is to provide a cost-effective and very manufacturable method of packaging a MEMS die.

Another object of the invention is to provide method of mounting a MEMS die (s) directly on a multi-layer flexible substrate.

Yet another object of the invention is to provide a package wherein a MEMS die (s) is mounted directly on a multi-layer flexible substrate.

According to the objects of the invention, a method of packaging a MEMS die is achieved. At least one MEMS die is mounted directly on a multi-layer flexible substrate having at least one metal layer. Electrical connections are made between the MEMS die and the flexible substrate. The MEMS die and electrical connections are protected with a lid or die coating.

Also according to the objects of the invention, a MEMS die (s) mounted directly on a multi-layer flexible substrate having at least one metal layer is achieved. An integrated circuit packaging structure comprises a MEMS die mounted directly on a flexible substrate and wire-bonded to the flexible substrate and a lid or die coating protecting the MEMS die and wire bonds.

BRIEF DESCRIPTION OF THE DRAWINGS

In the accompanying drawings forming a material part of this description, there is shown.

DESCRIPTION OF THE PREFERRED EMBODIMENTS

The present disclosure details a method for and a device comprising a gyro MEMS sensor package in integrated circuit packages and modules. The method and device of the present disclosure hold a number of advantages over the traditional gyro sensor ceramic package sensing technologies as the MEMS die(s) is mounted directly on the flex surface of a multi-layer flexible substrate which offers a significant area reduction on the package size, lower profile, and lighter weight, as compared to traditional ceramic packages.

Figure 1:
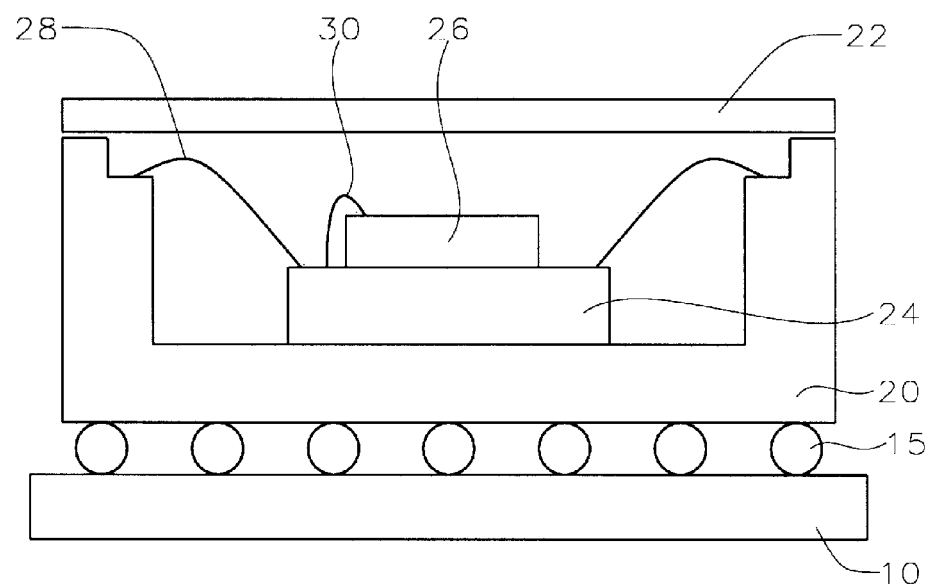
FIG. 1 schematically illustrates in cross-sectional representation a MEMS package of the prior art.

The MEMS gyro package is redesigned to achieve a smaller sensor footprint. Currently, the commercially available MEMS gyro package is approximately 7×7×3.3 mm which contains the MEMS die of only approximately 140×140×110 µm within a fully enclosed environment, as shown, for example, in FIG. 1.

Figure 2:
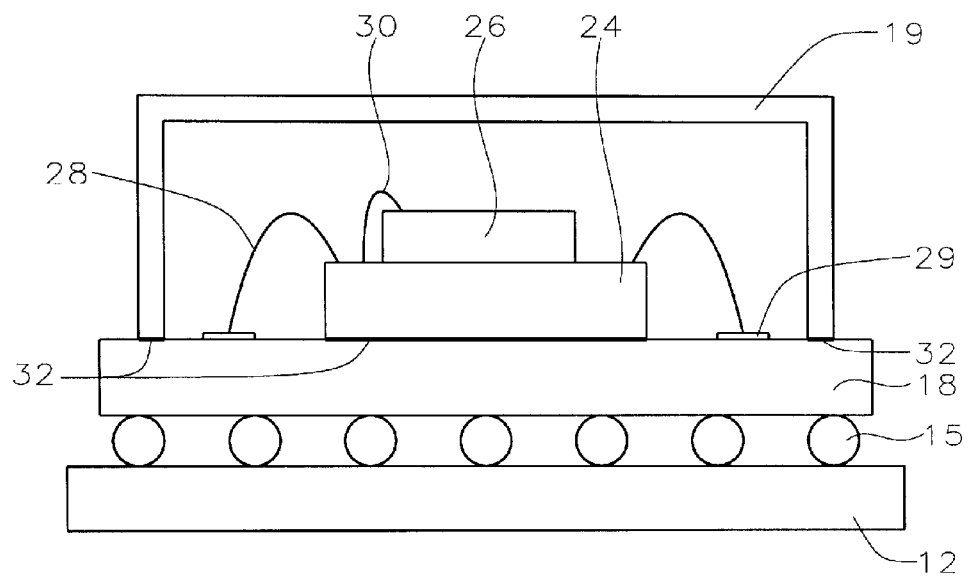
FIGS. 2-9 schematically illustrate in cross-sectional representation MEMS packages of the present disclosure.

In this disclosure, to reduce the size of the gyro assembly, the design of the enclosure is modified to eliminate the thickness contributed by the bottom side of the ceramic enclosure 20. As shown in FIG. 2, the MEMS dies are bonded to an interposer flex circuit or multi-layer flexible substrate 18 by standard die attach, such as conductive or non-conductive epoxy 32.

The flexible substrate technology can include finer line width than the conventional package and spacing of less than 10 µm. The flexible substrate technology can offer small vias of less than 10 µm to connect the different conductive metal layers.

The flexible substrate has at least one metal layer and can be one conductive metal layer or more than one conductive metal layer. Additionally, the flexible substrate can have double sided conductive metal layers or more than two stack-up conductive metal layers. The dielectric material in the flexible substrate may be polyimide (PI), liquid crystal polymer (LCP), Polyester (PET), polyethylene-naphthalate (PEN), poly tetra fluoro ethylene, or a laminate substrate such as epoxies and BT, or Teflon or modified Teflon.

Wire bonding 28, 30 through, for example, gold fingers 29 completes the electrical connections. Wire bonds may be copper, gold, paladium, aluminum, or any other conductive metals or alloys.

A single piece of metallic or liquid crystal polymer (LCP) lid 19, attached by epoxy 32, is used to protect the MEMS die from foreign particles. This gyro MEMS die assembly could then be handled as a component for mounting onto the main circuit (PCB or flex printed circuit board (FPCB)) 12 by methods such as soldering 15. The soldering material comprises eutectic PbSn or any lead-free Sn Ag or Sn Ag Cu, or by a combination of a conductive adhesive or solder with a non-conductive adhesive. It is estimated that using this design, the MEMS package size could be reduced to 6×6×2 mm, which is equivalent to a volumetric reduction of approximately 55%.

Figure 3:
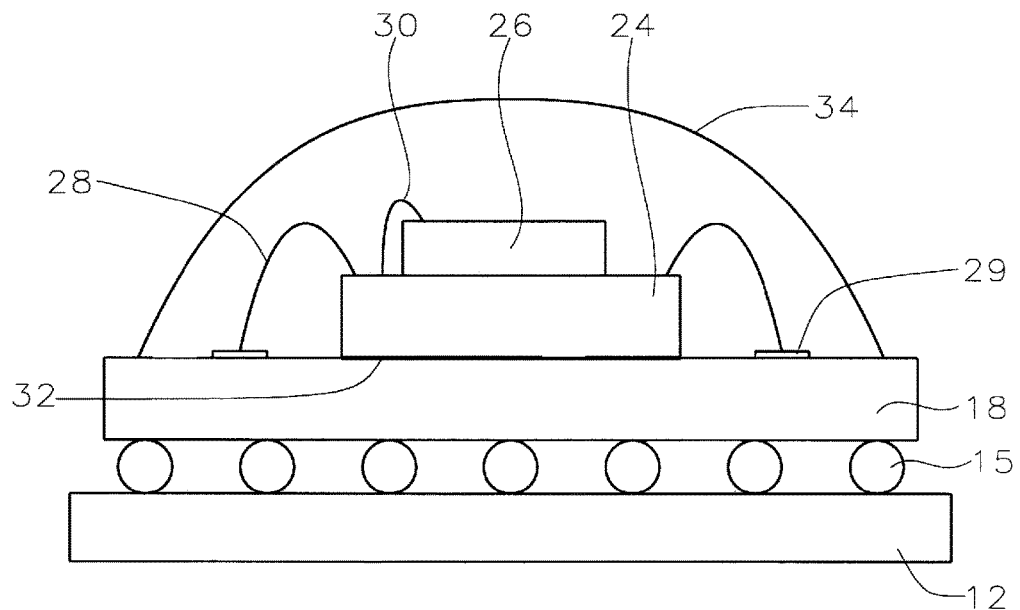

To further reduce the spatial requirement of the MEMS gyro package, the enclosure is eliminated with wire connections 28, 30 and MEMS die fully protected by die coating 34, as shown in FIG. 3. This design could result in a volumetric reduction of approximately 80% for each set of the MEMS gyro.

Figure 4:
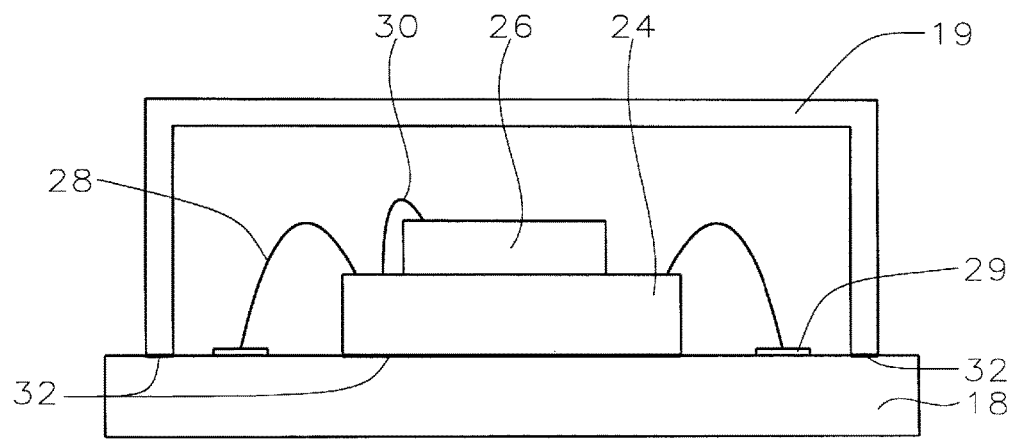
Figure 5:
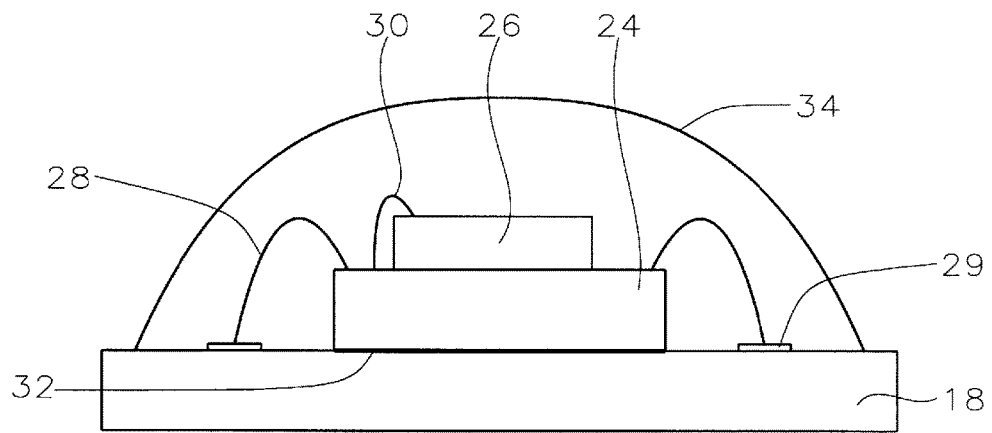

To even further minimize the gyro footprint, the MEMS die is placed directly onto the sensor multi-layer flexible circuit 18, in FIGS. 4 and 5, which eliminates the need for the flex interposer. Using conductive/non-conductive paste or film epoxy 32, a solder reflow process is not needed which further reduces the die profile upon the main circuitry, in addition to the possible benefits gained from a simplified manufacturing procedure. In FIG. 4, metal or LCP lid 19 is attached to the flex substrate 12 using epoxy 32. In FIG. 5, die coating 34 protects the MEMS die.

In parallel to the modification to the gyro package design, the main circuit is also modified to enhance the size and weight reduction. In the existing sensor design, the main PCB circuit is based on a 4 metal layer (ML) rigid flex stackup which comprises a 2 ML PCB board and a 2 ML flex joined by soldering.

To reduce the overall substrate thickness and weight, a piece of multi metal layer (e.g. 4 metal layer) flex 18 is used as the main circuit substrate. The multi metal layer flex could be based on a multi core or single core design. Such design eliminates the soldering process as required by the established rigid flex design. The use of a multi-layer flexible substrate also allows fine pitch circuitry with via sizes of less than 10 μm diameter and trace width and spacing of less than 10 μm.

The MEMS die (s) mounted directly on a multi-layer flexible substrate allows for a smaller, thinner, and lighter gyro MEMS sensor package in integrated circuit packages and modules. The MEMS die 24 with MEMS cap 26 can be directly mounted onto the flexible substrate 18 using non-conductive or conductive epoxy 32. This results in an ultra small package size, eliminating the BGA pads as seen on the ceramic package. Because of the thinner overall package thickness, the wire bond 28 from the MEMS die to flex can be done with lower loop height.

Figure 6:
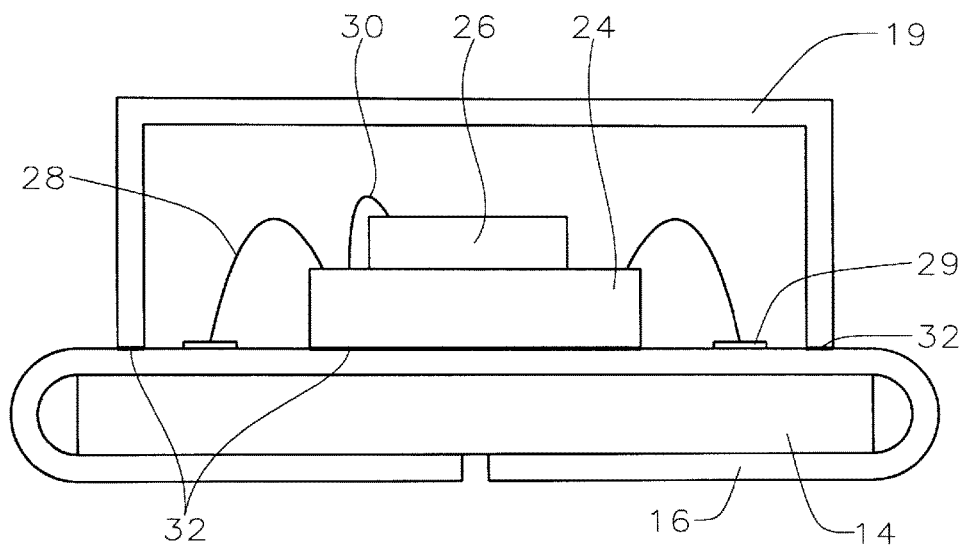
Figure 7:
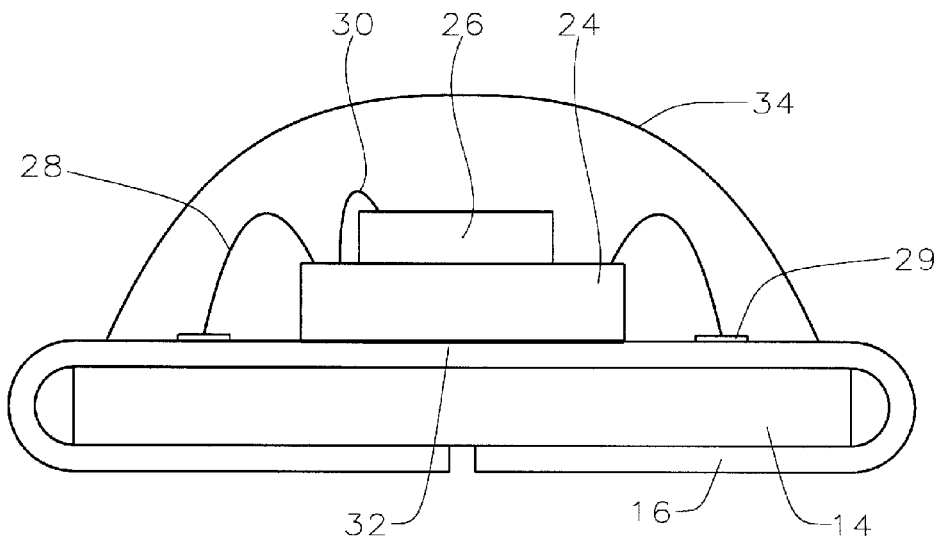
Figure 8:
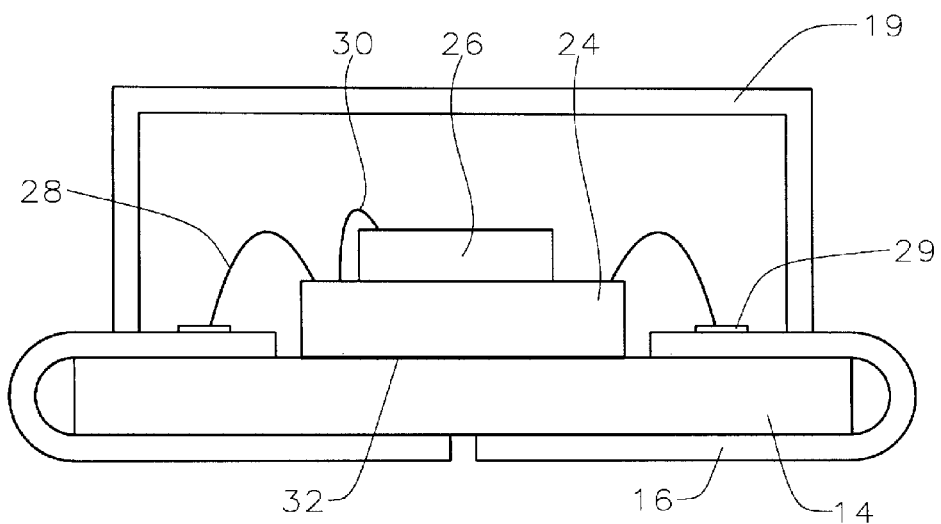
Figure 9:
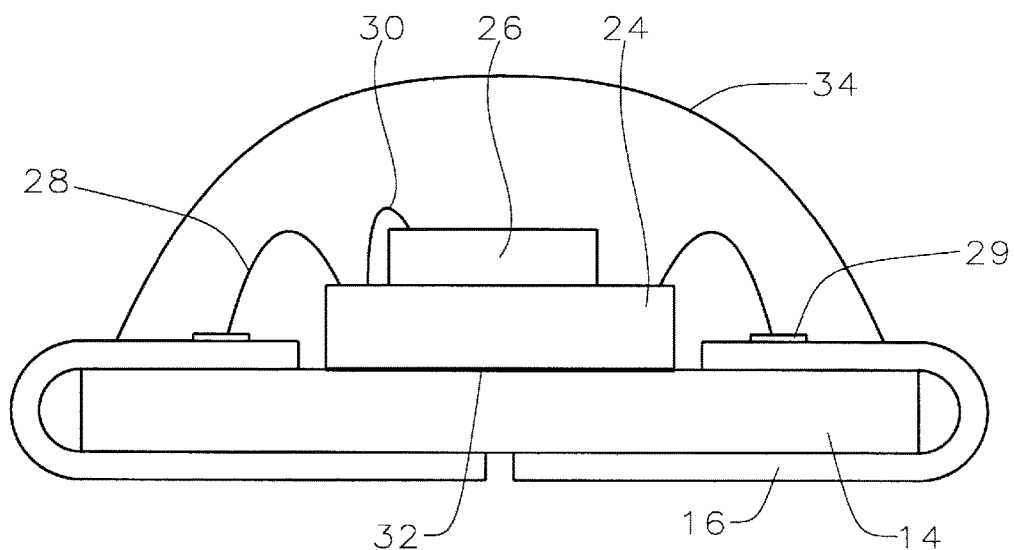

For structural rigidity, as shown in FIGS. 6-9, stainless steel stiffeners 14 could be used as in the existing design whilst the flexibility of the flex 16 is maintained for folding after the MEMS gyro attachment. FIGS. 6 and 7 show the at least one MEMS die attached to the flexible substrate 16 using conductive or non-conductive epoxy paste or film 32. In FIGS. 8 and 9, the at least one MEMS die is die attached directly onto the stiffener 14. In all of these figures, the multi-layer flexible substrate 16 is wrapped around the stiffener 14. The stiffener material can be copper, aluminum, stainless steel, ceramic, zinc, or tungsten, for example, or any other metal. The flexible substrate 16 can be folded around the stiffener either before or after placement of the dies.

As in the previous embodiments, the flexible substrate 16 has at least one metal layer and can be one conductive metal layer or more than one conductive metal layer. Additionally, the flexible substrate can have double sided conductive metal layers or more than two stack-up conductive metal layers. The dielectric material in the flexible substrate may be polyimide (PI), liquid crystal polymer (LCP), Polyester (PET), polyethylene-naphthalate (PEN), poly tetra fluoro ethylene, or a laminate substrate such as epoxies and BT, or Teflon or modified Teflon.

While the invention has been particularly shown and described with reference to the preferred embodiments thereof, it will be understood by those skilled in the art that various changes in form and details may be made without departing from the spirit and scope of the invention.

What is claimed is:

1. An integrated circuit packaging structure comprising:
   at least one Micro Electrical Mechanical Systems (MEMS) die mounted directly on a multi-layer flexible substrate and wire-bonded to said flexible substrate wherein said flexible substrate has at least one metal layer and wherein said flexible substrate remains underlying said MEMS die;
   a MEMS cap mounted on said at least one MEMS die and wirebonded to said MEMS die; and
   a lid or die coating protecting sides and top surfaces of said MEMS die and wire bonds.

2. The structure according to claim 1 wherein said at least one MEMS die comprises a gyroscope.

3. The structure according to claim 1 wherein said at least one MEMS die is mounted on said flexible substrate by conductive or non-conductive epoxy paste or film.

4. The structure according to claim 1 wherein said MEMS die is wire-bonded to gold fingers on said flexible substrate.

5. The structure according to claim 1 wherein said die coating encapsulates said MEMS die and wire bonds.

6. The structure according to claim 1 wherein said lid comprises metal or liquid crystal polymer and wherein said lid is attached to said flexible substrate by conductive or non-conductive epoxy.

7. The structure according to claim 1 wherein said flexible substrate is attached to a multi-layer flexible substrate on a side opposite to said MEMS die wherein said multi-layer flexible substrate comprises one or more conductive metal layers and one or more dielectric layers wherein said attaching is by solder or conductive adhesive or a combination of solder and conductive adhesive.

8. The structure according to claim 1 wherein said flexible substrate is a multi-layer flexible substrate comprising one or more conductive metal layers and one or more dielectric layers.

9. A method of assembling an integrated circuit packaging structure comprising:
   mounting one or more Micro Electrical Mechanical Systems (MEMS) dies directly on a multi-layer flexible substrate having at least one metal layer wherein said flexible substrate remains underlying said MEMS die;
   mounting a MEMS cap mounted on each of said one or more MEMS dies;
   making electrical connections between each said MEMS cap and said MEMS die and between said one or more MEMS dies and said flexible substrate; and
   protecting top and side surfaces of said MEMS die and electrical connections with a lid or die coating.

10. The method according to claim 9 wherein said one or more MEMS dies comprises gyroscopes.

11. The method according to claim 9 wherein said at least one MEMS die is mounted on said flexible substrate by conductive or non-conductive epoxy paste or film.

12. The method according to claim 9 wherein said making electrical connections comprises wire-bonding said MEMS die to gold fingers on said flexible substrate and wherein wire bonds comprise Cu, Au, Pd, or Al.

13. The method according to claim 9 wherein said die coating encapsulates said MEMS die and wire bonds.

14. The method according to claim 9 wherein said lid comprises metal or liquid crystal polymer and wherein said lid is attached to said flexible substrate by conductive or non-conductive epoxy.

15. The method according to claim 9 further comprising:
attaching said flexible substrate to a multi-layer flexible substrate on a side opposite to said MEMS die wherein said multi-layer flexible substrate comprises one or more conductive metal layers and one or more dielectric layers wherein said attaching comprises solder or conductive adhesive or a combination of solder and conductive adhesive.

16. A Micro Electrical Mechanical Systems (MEMS) gyroscope package comprising:
only one or more MEMS gyroscope dies mounted directly on a multi-layer flexible substrate having at least one metal layer and wire-bonded to said flexible substrate wherein said flexible substrate has at least one metal layer and wherein said flexible substrate remains underlying said MEMS die;
a MEMS cap mounted on each of said one or more MEMS gyroscope dies and wirebonded to said MEMS gyroscope dies; and
a lid or die coating protecting top and side surfaces of said MEMS die and wire bonds.

17. The structure according to claim 16 wherein said die coating encapsulates said MEMS die and wire bonds.

18. The structure according to claim 16 wherein said lid comprises metal or liquid crystal polymer and wherein said lid is attached to said flexible substrate by conductive or non-conductive epoxy.

19. The structure according to claim 16 wherein said flexible substrate is attached to a multi-layer flexible substrate on a side opposite to said MEMS die wherein said multi-layer flexible substrate comprises one or more conductive metal layers and one or more dielectric layers wherein said attaching is by solder or conductive adhesive or a combination of solder and conductive adhesive.

20. The structure according to claim 16 wherein said flexible substrate is a multi-layer flexible substrate comprising one or more conductive metal layers and one or more dielectric layers.

* * * * *